(12) United States Patent
Lin et al.

(10) Patent No.: US 7,991,497 B2
(45) Date of Patent: Aug. 2, 2011

(54) METHOD AND SYSTEM FOR DEFECT DETECTION IN MANUFACTURING INTEGRATED CIRCUITS

(75) Inventors: Paul Kuang-Chi Lin, Shanghai (CN); Sophia Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 382 days.

(21) Appl. No.: 12/258,786

(22) Filed: Oct. 27, 2008

(65) Prior Publication Data
US 2010/0004775 A1 Jan. 7, 2010

(30) Foreign Application Priority Data
Jul. 2, 2008 (CN) .......................... 2008 1 0040282

(51) Int. Cl.
*G06F 19/00* (2011.01)
(52) U.S. Cl. .......................... 700/108; 700/109; 700/110
(58) Field of Classification Search ........... 700/108–110
See application file for complete search history.

(56) References Cited

U.S. PATENT DOCUMENTS

| | | | |
|---|---|---|---|
| 6,073,501 A | 6/2000 | Rohner | |
| 6,507,933 B1 | 1/2003 | Kirsch et al. | |
| 6,535,776 B1 | 3/2003 | Tobin et al. | |
| 6,640,151 B1 * | 10/2003 | Somekh et al. | 700/121 |
| 6,701,204 B1 | 3/2004 | Nicholson | |
| 6,841,403 B2 | 1/2005 | Tanaka et al. | |
| 7,012,684 B1 * | 3/2006 | Hunter | 356/237.5 |
| 7,062,409 B2 * | 6/2006 | Kadota | 702/182 |
| 2003/0226098 A1 * | 12/2003 | Weng | 714/798 |

OTHER PUBLICATIONS

"Subchapter 14a. The Kruskal-Wallis Test for 3 or More Independent Samples", Richard Lowry, Archived web article from Jan. 2006.*
Hollander, M. et al., "Nonparametric Statistical Methods", (1973), New York, John Wiley & Sons, pp. 115-120.

* cited by examiner

*Primary Examiner* — Michael D Masinick
(74) *Attorney, Agent, or Firm* — Kilpatrick Townsend and Stockton LLP

(57) ABSTRACT

Method and system for defect detection in manufacturing integrated circuits. In an embodiment, the invention provides a method for identifying one or more sources for possible causing manufacturing detects in integrated circuits. The method includes a step for providing a plurality of semiconductor substrates. The method includes a step for processing the plurality of semiconductor substrates in a plurality of processing steps using a plurality of processing tools. The method additionally includes a step for providing a database, which includes data associated with the processing of the plurality of semiconductor substrates. The method further includes a step for testing the plurality of semiconductor wafers after the processing of the plurality of semiconductor substrates. Additionally, the method includes a step for detecting at least one defect characteristic associated with the plurality of the semiconductor substrates that have been processed. Moreover, the method includes a step for identifying a set of processing steps. For example, the set of processing step are possibly associated with the defect characteristic.

24 Claims, 10 Drawing Sheets

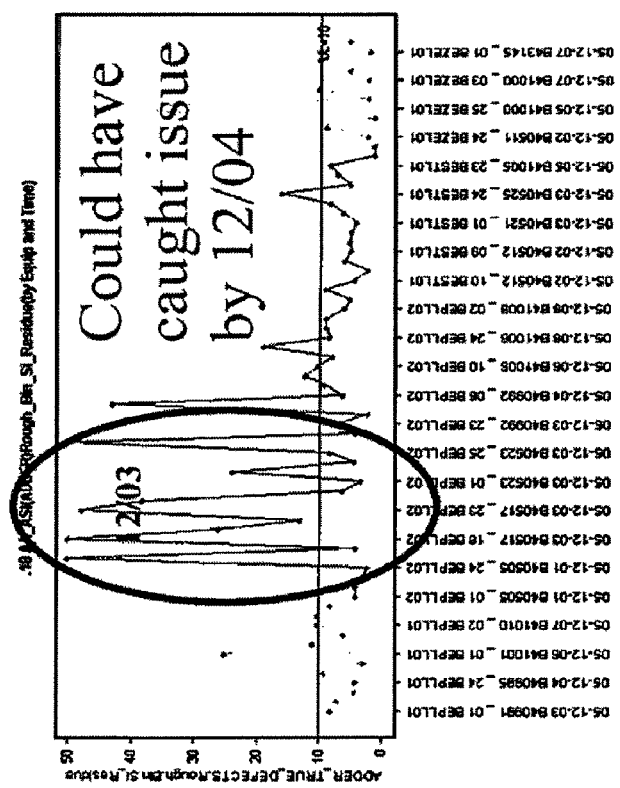
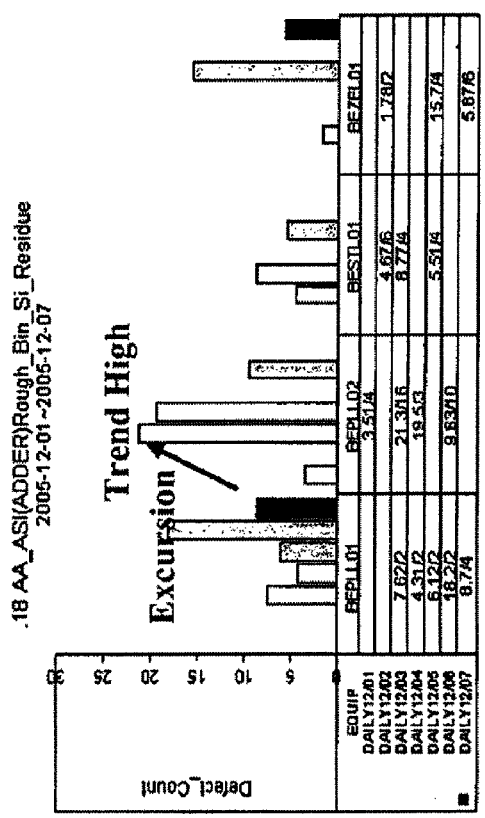
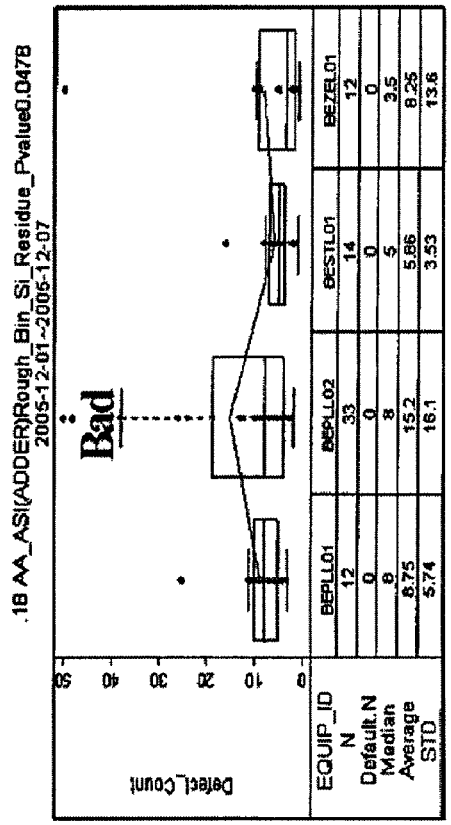
FIGURE 1B

WIP Data

| TRACK_IN_TIME | PRODUCT_ID | STAGE | STEP_ID | LOT_ID | EQUIP_ID |
|---|---|---|---|---|---|
| 2005/07/20 00:10:05 | 0519A.7 | M1-ET | BPETM11 | B32065 | BEMEA06 |
| 2005/07/6 00:11:22 | 0519A.7 | M5-ET | BPETM51 | B32351 | BEMEA09 |
| 2005/08/20 00:39:19 | 0519A.7 | M2-ET | BPETM21 | B32355 | BENEA01 |
| 2005/09/20 00:53:33 | 0519A.7 | M2-ET | BPETM21 | B32367 | BEMEA06 |

← 501

Match Table

| PRODUCT_ID | LAYER_STEP_ID | STEP_ID | AMEND_INDEX | INSPECT_EQUIP_ID | CLASS | Group |
|---|---|---|---|---|---|---|
| 0519 | M1_ASI | BPETM11 | 1 | KLA* | Pat_Fail | .18 M* ASI |
| 0519 | M2_ASI | BPETM21 | 1 | KLA* | Pat_Fail | .18 M* ASI |
| 0519 | M3_ASI | BPETM31 | 1 | KLA* | Pat_Fail | .18 M* ASI |
| 0519 | M4_ASI | BPETM41 | 1 | KLA* | Pat_Fail | .18 M* ASI |
| 0519 | M5_ASI | BPETM51 | 1 | KLA* | Pat_Fail | .18 M* ASI |

← 502

Defect Data

| SCAN_DATE_TIME | DEVICE | LOT_ID | WAFER_ID | LAYER_STEP_ID | ADDER_TRUE | DEFECTS=Manual-False | Manual-Unknown | Rough-Burried P/D | Manual-CMP_SC | Rough-Surface |
|---|---|---|---|---|---|---|---|---|---|---|
| 2005/11/10 00:19:42 | 0770 | B40695 | 01 | AA_ASI | | 0 | 0 | 0 | 0 | 0 |
| 2005/11/10 00:19:42 | 0770 | B40695 | 24 | AA_ASI | | 0 | 0 | 0 | 0 | 0 |
| 2005/11/10 00:38:15 | 0770 | B39427 | 01 | M2_DEP | | 0 | 0 | 0 | 0 | 0 |
| 2005/11/10 00:38:15 | 0770 | B39427 | 02 | M2_DEP | | 0 | 0 | 0 | 0 | 0 |

← 503

Defect Columns

FIGURE 5

| Group | DEFECT TYPE | EQUIP ID | Pvalue | N | AVG | Median | IQR |
|---|---|---|---|---|---|---|---|
| .18 IMD* HDP | ADDER_TRUE_DEFECTS.ADC.Bin.Surface_P.D | BTSGA01 | 7.63E-11 | 61 | 5.836066 | 4 | 5 |
| .18 IMD* HDP | ADDER_TRUE_DEFECTS.ADC.Bin.Surface_P.D | BTSGA02 | 7.63E-11 | 266 | 6.672932 | 5 | 4.75 |
| .18 I* DEP | ADDER_TRUE_DEFECTS.ADC.Bin.Surface_P.D | BTALA59 | 9.68E-07 | 161 | 0.018634 | 0 | 0 |
| .18 I* DEP | ADDER_TRUE_DEFECTS.ADC.Bin.Surface_P.D | BTALA60 | 9.68E-07 | 73 | 0.082192 | 0 | 0 |
| .18 AA ASI | ADDER_TRUE_DEFECTS.ADC.Bin.Si_Residue | BEPLL01 | 3.14E-01 | 12 | 0 | 0 | 0 |
| .18 AA ASI | ADDER_TRUE_DEFECTS.ADC.Bin.Si_Residue | BEPLL02 | 3.14E-01 | 33 | 1.878788 | 0 | 0 |
| .18 IMP | ADDER_TRUE_DEFECTS.ADC.Bin.Surface_P.D | BIMCI07 | 3.95E-01 | 29 | 0 | 0 | 0 |
| .18 IMP | ADDER_TRUE_DEFECTS.ADC.Bin.Surface_P.D | BIMCI08 | 3.95E-01 | 6 | 0 | 0 | 0 |

METHOD AND SYSTEM FOR DEFECT DETECTION IN MANUFACTURING INTEGRATED CIRCUITS

CROSS-REFERENCE TO RELATED APPLICATIONS

This application claims priority to Chinese Patent Application No. 200810040282.2, filed Jul. 2, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and system for automated defect diction for the manufacture of integrated circuits. Merely by way of example, the invention has been applied to detecting defects using non-parametric statistical tools for the manufacturing of integrated circuits. But it would be recognized that the invention has a much broader range of applicability. For example, the invention can be applied to detecting defects in other manufacturing processes.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is defects detection tools used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, tools for detecting defects during the manufacturing process have are often inadequate.

Typically, the manufacturing of integrated circuits involves many processing steps and processing tools. Due to costs and other practical considerations, integrated circuits (or rather partially processed integrated circuits) are not tested at every processing step. As a result, it is often difficult to isolate and identify the sources of manufacturing defects. In the past, various techniques (e.g., statistical tool implemented with parametric models, etc.) have been used to isolate and identify sources of manufacturing devices. Unfortunately, these techniques are often inadequate.

From the above, it is seen that an improved technique for determining sources of semiconductor manufacturing defects.

BRIEF SUMMARY OF THE INVENTION

The present invention is directed to integrated circuits and their processing for the manufacture of semiconductor devices. More particularly, the invention provides a method and system for automated defect diction for the manufacture of integrated circuits. Merely by way of example, the invention has been applied to detecting defects using non-parametric statistical tools for the manufacturing of integrated circuits. But it would be recognized that the invention has a much broader range of applicability. For example, the invention can be applied to detecting defects in other manufacturing processes.

In a specific embodiment, the invention provides a method for identifying one or more sources for possible causing manufacturing detects in integrated circuits. The method includes a step for providing a plurality of semiconductor substrates. The method also includes a step for processing the plurality of semiconductor substrates in a plurality of processing steps using a plurality of processing tools. The method additionally includes a step for providing a database, which includes data associated with the processing of the plurality of semiconductor substrates. The method further includes a step for testing the plurality of semiconductor wafers after the processing of the plurality of semiconductor substrates. Additionally, the method includes a step for detecting at least one defect characteristic associated with the plurality of the semiconductor substrates that have been processed. Moreover, the method includes a step for identifying a set of processing steps. For example, the set of processing step are possibly associated with the defect characteristic. Furthermore, the method includes a step for identifying a set of processing tools based on the data. For example, the processing tools are possibly associated with the set of processing steps and the defect characteristics. The set of processing steps is a subset of the plurality of processing steps. The set of processing tools is a subset of the plurality of processing tools. In addition, the method includes a step for determining a Kruskal-Wallis value. The Kruskal-Wallis value is associated with the set of processing steps and the set of processing tools. Moreover, the method includes a step for identifying a likely source for the at least one defect characteristic based on the Kruskal-Wallis value.

According to another embodiment, the present invention provides a system for identifying a source for manufacturing detects. Depending upon application, the system is used in conjunction with a semiconductor manufacturing entity. The semiconductor entity includes a plurality of processing tools for processing a plurality of semiconductor substrates in a plurality of processing steps. The system includes a memory component for storing at least data, which are related to the processing tools and processing steps associated with at least one of the plurality of semiconductors. The system also includes a testing component that is configured for testing processed semiconductor substrates. For example, the testing component is able to detect at least one defect characteristic. The at least one defect characteristic are possible associated with a set of processing steps and a set of processing tools.

The set of processing steps is a subset of the plurality of processing steps. The set of processing tools is a subset of the plurality of processing tools. The system also includes an analyzing component that is configured to obtain a set of data from the memory component. The set of data is associated with the defect characteristic. The analyzing component is also configured to determine a Kruskal-Wallis value based on the set of data and to identify at lease one likely source for the defect characteristic.

According to yet another embodiment, the present invention provides a method for identifying a source for manufacturing detects for integrated circuits. The method includes a step for providing a plurality of semiconductor substrates. The method also includes a step for processing the plurality of semiconductor substrates in a plurality of processing steps using a plurality of processing tools. The method additionally includes a step for providing a database, which includes data associated with the processing of the plurality of semiconductor substrates. The method also includes a step for testing the plurality of semiconductor wafers after the processing of the plurality of semiconductor substrates. The method additionally includes a step for identifying at least one defect characteristic associated with the plurality of the semiconductor substrates that have been processed. In addition, the method includes a step for identifying a set of processing steps, which is possibly associated with the defect characteristic. Furthermore, the method includes a step for identifying a set of processing tools based on the data. The set of processing tools is possibly associated with the set of processing steps and the defect characteristics. The method further includes a step for determining a distribution of the at least one defect characteristic over the set of processing steps. In addition, the method includes a step for determining at least one ranking value using a non-parametric equation. Moreover, the method includes a step for identifying a likely source for the at least one defect characteristic based on the at least one ranking value.

It is to be appreciated that various embodiments of the present invention provide many advantages over conventional techniques. According to certain embodiments, the present invention utilizes non-parametric statistical tools to identify sources for manufacturing defects. For example, an embodiment of the present invention uses the Kruskal-Wallis test to identify late latent defects. According to a specific embodiment, the present invention provides a fast and automated solution for identifying sources for defects. For example, data relating to the processing of semiconductor substrates are automatically collected and analyzed. In addition, it is to be appreciated the various embodiments of the present invention are compatible with existing and conventional techniques. There are other benefits as well.

Various additional objects, features and advantages of the present invention can be more fully appreciated with reference to the detailed description and accompanying drawings that follow.

BRIEF DESCRIPTION OF THE DRAWINGS

FIG. 5 is a simplified diagram illustrating processed data according to an embodiment of the present invention.

FIGS. 6-8 are simplified diagram illustrating various statistical methods used for identifying sources for defects.

DETAILED DESCRIPTION OF THE INVENTION

The present invention is directed to integrated circuits and their processing for the manufacture of semiconductor devices. More particularly, the invention provides a method and system for automated defect diction for the manufacture of integrated circuits. Merely by way of example, the invention has been applied to detecting defects using non-parametric statistical tools for the manufacturing of integrated circuits. But it would be recognized that the invention has a much broader range of applicability. For example, the invention can be applied to detecting defects in other manufacturing processes.

As explained above, detecting manufacturing defects and identifying the likely sources of manufacturing defects are important for the manufacturing of semiconductor wafers. In the past, various conventional techniques have been developed. Unfortunately, conventional techniques are often inadequate.

For example, one of the methods for identifying sources of defects has been commonality test. To perform a commonality test, common processing steps or processing tools that produces defective integrated circuits are identified. However, since the manufacturing of integrated circuit as a fab facility often entails hundreds or even thousands of processing steps and/or processing tools, it is infeasible to isolate and identify the source that causes defect. For example, the commonality test often requires testing and analysis at each processing step.

Typically, more cost effective techniques are used. For example, one of the techniques has been using parametric statistical tools (i.e., under the assumption that the distribution of defects is normal) to identify possible sources for defects.

Figure 1A:
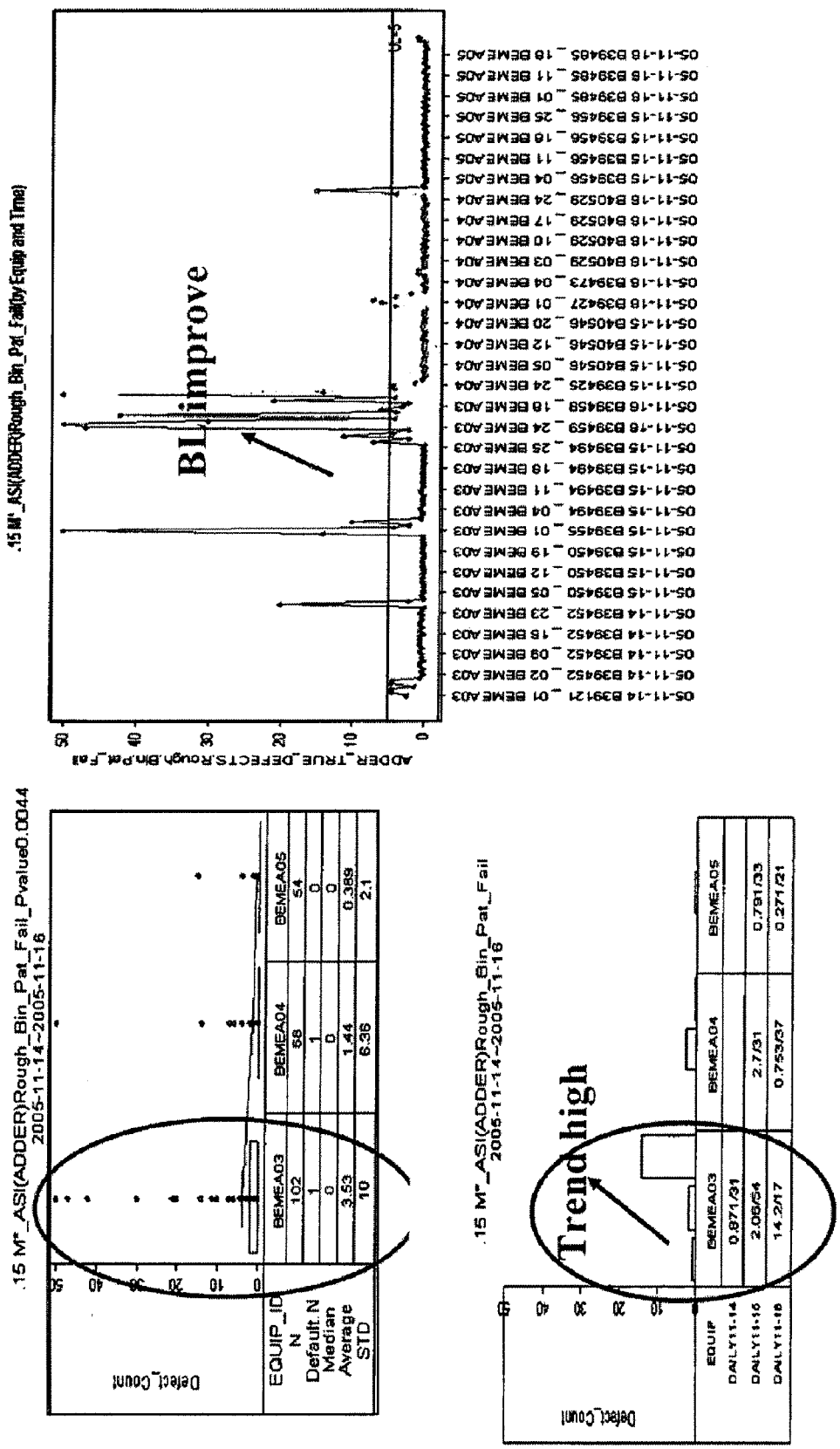
FIGS. 1-2 are simplified diagrams illustrating conventional techniques for identifying sources for defects.
Figure 2:
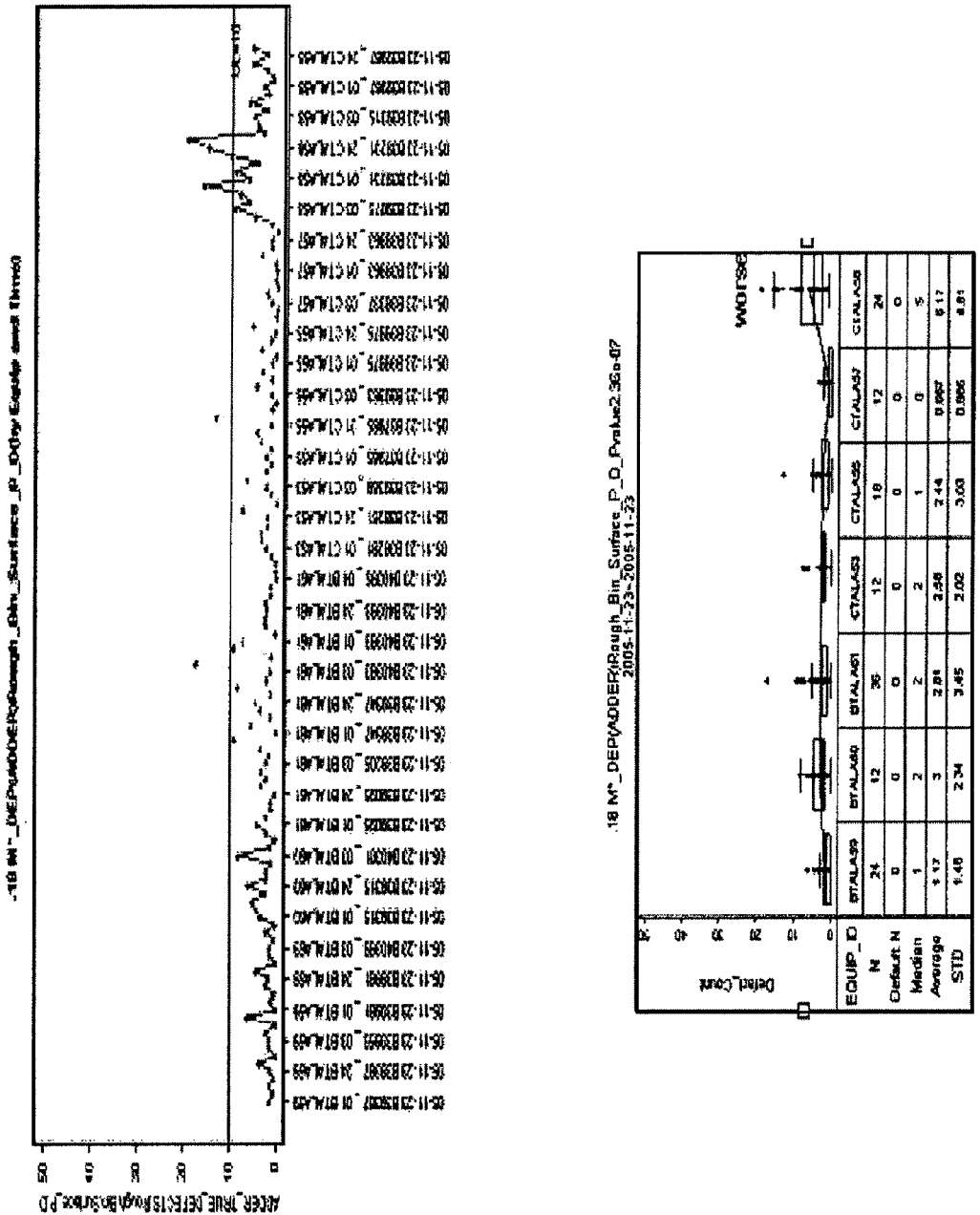

FIGS. 1-2 are simplified diagrams illustrating conventional techniques for identifying sources for defects. These diagrams merely provide example, which should not unduly limit the scope of the claims. One of ordinary skill in the art would recognize many variations, alternatives, and modifications. As can be seen in FIGS. 1-2, conventional techniques identify likely sources for defects by determines tools or processing steps that are associated with the highest count and/or rate of defective integrated circuits. As an example, some conventional techniques involve assigning different weights to processing steps in calculation.

Unfortunately, conventional techniques as illustrated in FIGS. 1-2 are often ineffective. For example, conventional techniques, under the assumption that defects follow a pattern of normal distribution, are ineffective in identifying latent defects, which do not follow the normal distribution pattern.

Therefore, it is to be appreciated that according to certain embodiments, the present invention provides an improved method for identifying a source for semiconductor manufacturing defects.

Figure 3:
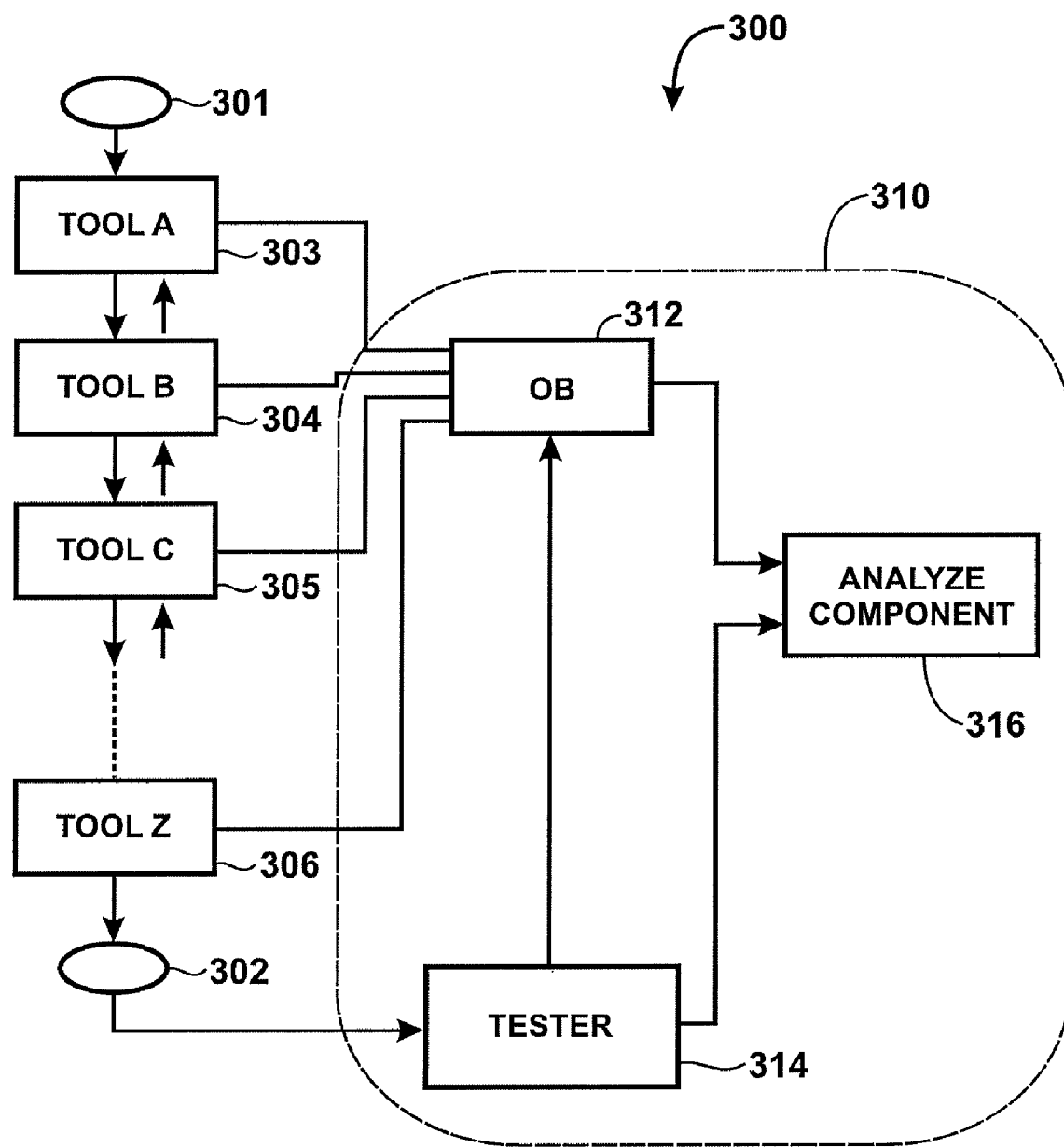
FIG. 3 is a simplified diagram illustrating a system for identifying sources for semiconductor defects according to an embodiment of the present invention.

FIG. 3 is a simplified diagram illustrating a system for identifying sources for semiconductor defects according to an embodiment of the present invention. This diagram is merely an example, which should not unduly limit the scope of the claims. One of ordinary skill in the art would recognize many variations, alternatives, and modifications.

A system 300 includes, among other things, a database component 312, a testing component 314, and an analyze component 313. According to an embodiment, the system 300 is implemented in conjunction with semiconductor processing tools 303-306 used for the manufacturing of integrated circuits. For example, semiconductor substrate 301 is processed by processing tools 303-306. As merely an example, each of the processing tools is able to perform one or more processing steps, and various processing steps may be repeated.

According to various embodiments, the system 300 may be implemented with various automated tools. For example, the analyze component 313 is implemented with a network computer that provides human interface. As another example, records of processing are automatically stored in the database component 312. According to an embodiment, the database component 312 and the analyze component are implemented using the same network computer.

Figure 4:
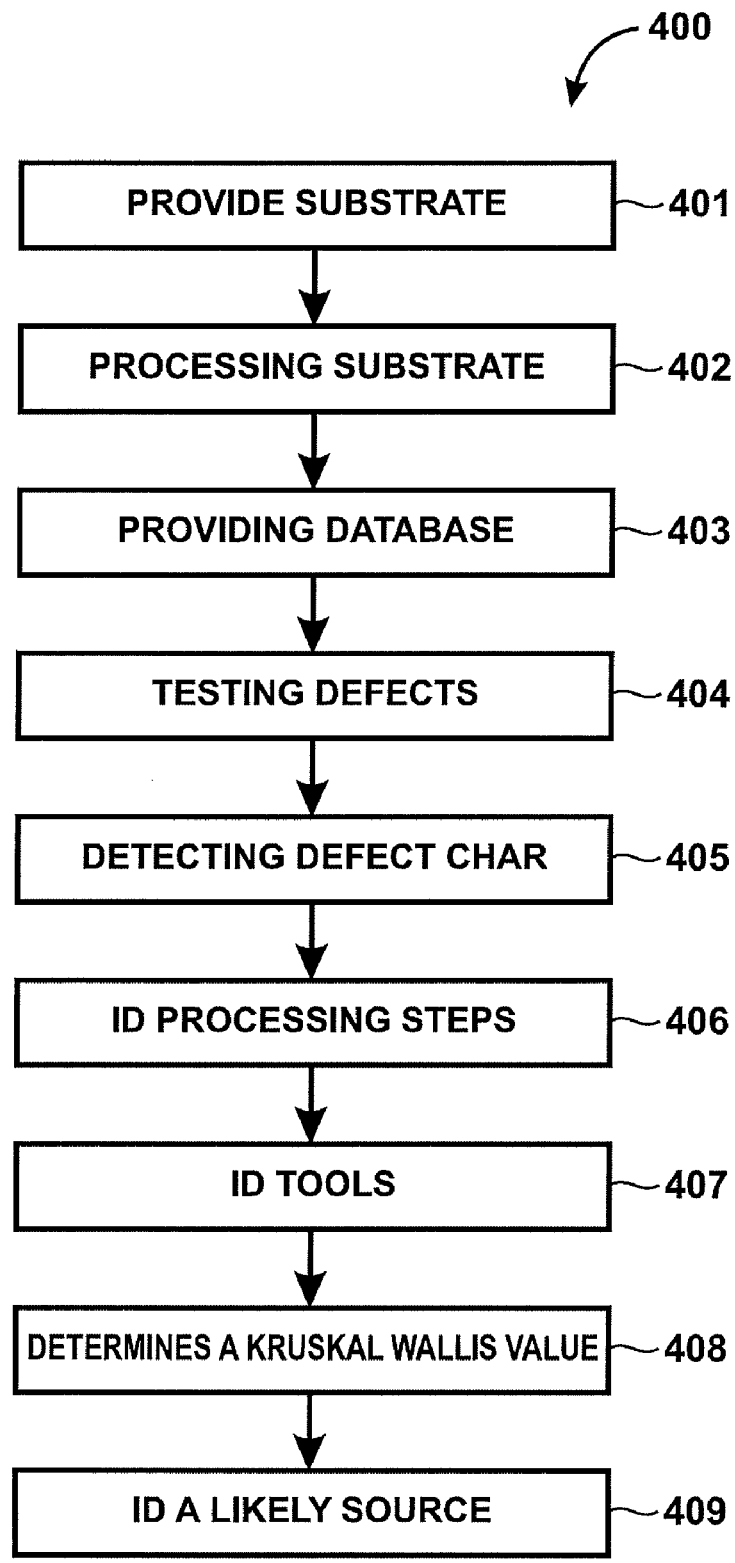
FIG. 4 is a simplified diagram illustrating a method for identifying sources for semiconductor defects according to an embodiment of the present invention.

FIG. 4 is a simplified diagram illustrating a method for identifying sources for semiconductor defects according to an embodiment of the present invention. This diagram is merely an example, which should not unduly limit the scope of the claims. One of ordinary skill in the art would recognize many variations, alternatives, and modifications. For example, various steps may be added, removed, replaced, rearranged, repeated, overlapped, and/or partially overlapped and should not unduly limit the scope of the claims.

At step 401, a semiconductor substrates are provided and to be processed. As defined herein, the term "substrate" or "substrates" can be interpreted by a meaning consistent with one of ordinary skill in the art. That is, the term substrate can include bulk substrates, multi-layered substrates (e.g., silicon wafer with overlying dielectric and metal films), graded substrates, silicon on insulator substrates, epitaxial silicon substrates, any combination of these, including layered substrates, partially processed wafers (including portions of integrated circuits and other elements), patterned and unpatterned wafers, and the like. Of course, there can be other variations, modifications, and alternatives. For example, the substrate material 301 in FIG. 3 is one of the semiconductor substrate that is to be processed.

At step 402, the semiconductor substrates are processed. According to a specific embodiment, the semiconductor substrates are process in many processing steps using processing tools. For example, the substrate 301 in FIG. 3 are is processed by processing tools 303-306, and one or more of the processing tools 303-306 performs more than one process. As an example, the processing tool 303 performs chemical vapor deposition on the substrate 301, the processing tool 304 performs etching, and the processing tool 303 performs ashing. Depending upon application, semiconductor substrates often go through many processing steps performed by various processing tools.

At step 403, a database is provided. For example, the database 312 in FIG. 3 is provided. According to an embodiment, the database is configured to store information associated with processing steps and processing tools. For example, the database interfaces with each of the processing tools and records each processing step performed by the processing tools. For example, the database stores processing records in the table 501 as shown in FIG. 5. FIG. 5 is a simplified diagram illustrating processed data according to an embodiment of the present invention.

At step 404, semiconductor wafers are tested for defects. For example, the testing component 314 tests processed (or partially processed) semiconductor substrates after the processed semiconductor substrates are processed by the processing tool 306. Depending upon application, tests to detect defects can be performed at different stages of processing. According to an embodiment, the testing component 314 is used to detect logic defects (e.g., adder test, etc.). It is to be appreciated that the testing component 314 is able to detect a variety types of defects.

At step 405, one or more defect characteristic is detected. According to an embodiment, the defect characteristic is detected by the testing component 314. For example, a batch of semiconductor substrates is detected as having the same defect characteristic.

At step 406, processing steps that might have caused or be associated with the defect characteristic are identified. According to an embodiment, the analyzing component 316 obtains records from the database 312. For example, the analyzing component 316 obtains processing records of semiconductor substrates that are identified to have defects to identify the processing steps that have been performed on these semiconductor substrates. For example, the processing steps are identified by way of using a match table 501 as shown in FIG. 5.

At step 407, processing tools that might have caused or be associated with the defect characteristic are identified. According to an embodiment, the analyzing component 316 obtains records from the database 312. For example, the analyzing component 316 obtains processing records of semiconductor substrates that are identified to have defects to identify the processing tools that have been used to perform processing steps identified in step 406.

At step 408, a Kruskal-Wallis value associated with the defects is calculated. Depending upon application, the Kruskal-Wallis value is effective in determining whether a distribution associated the defect is normal or abnormal. For example, the standard normal distribution (e.g., Gaussian distribution) is the normal distribution with a mean of zero and a standard deviation of one. In contrast, abnormal distribution does not have this characteristic.

Figure 9:
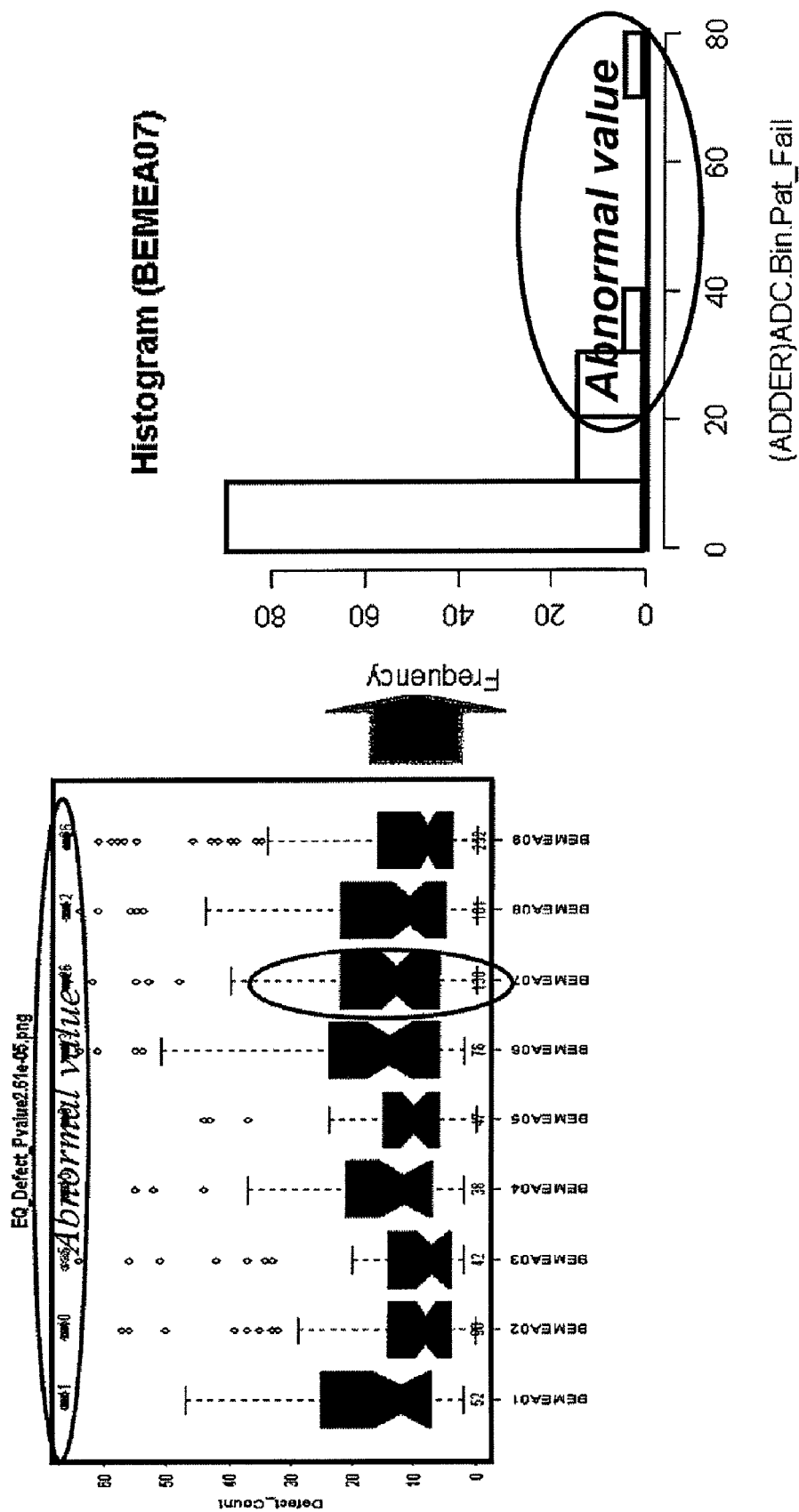
FIG. 9 is a simplified diagram illustrating an abnormal distribution.

FIG. 9 is a simplified diagram illustrating an abnormal distribution. This diagram is merely an example, which should not unduly limit the scope of the claims. One of ordinary skill in the art would recognize many variations, alternatives, and modifications. As shown in FIG. 9, the distribution does not have a mean of zero Now referring back to FIG. 4. According to an embodiment, the Kruskal-Wallis equation is used to determine a Kruskal-Wallis value, which is associated with the distributional characteristic of the defect. The Kruskal-Wallis equation may be expressed as the following:

$$K = (N-1) \frac{\sum_{i=1}^{g} n_i (\bar{r}_i - \bar{r})^2}{\sum_{i=1}^{g} \sum_{j=1}^{n_i} (r_{ij} - \bar{r})^2} \quad \text{(Equation 1)}$$

In Equation 1, the $n_g$ is the number of observations in group g. For example, $n_g$ is the number of processed semiconductor substrates that have defects and have been processed by a particular processing tool and/or a processing step. The term $r_{ij}$ is the rank (among all observations) of observation j from group i. The term N is the total number of observations across all groups. For example, the term N is the total number of processed semiconductor substrates that have defects. The term $\bar{r}$ is the average of all the $r_{ij}$ equal to $(N+1)/2$. The $\bar{r}$ can be expressed as the following:

$$\bar{r}_i = \frac{\sum_{j=1}^{n_i} r_{ij}}{n_i} \quad \text{(Equation 2)}$$

For example, since the denominator of the expression for K is (N−1)N(N+1)/12, Equation 1 may be expressed as the following:

$$K = \frac{12 \sum_{i=1}^{g} n_i (\bar{r}_i - \bar{r})^2}{N(N+1)} \quad \text{(Equation 3)}$$

At step 409, one or more likely sources (i.e., processing tools and/or processing step) is identified by determining a p-value according to the following:

$$Pr(\chi^2_{N-g} \geq K) \quad \text{(Equation 4)}$$

For example, for a specific processing tools and/or processing step, if the p-value is greater than a threshold value $X^2(K-1)$. Depending upon application, p-value may be calculated for a specific set of processing tools and/or processing steps.

It is to be appreciated that, depending upon embodiments, the present invention has broad range of applicability. According to certain embodiments, other types of non-parametric statistical methods (e.g., Poisson regression equation and/or Avona equation) may be used to identify likely sources of defects.

Figure 7:
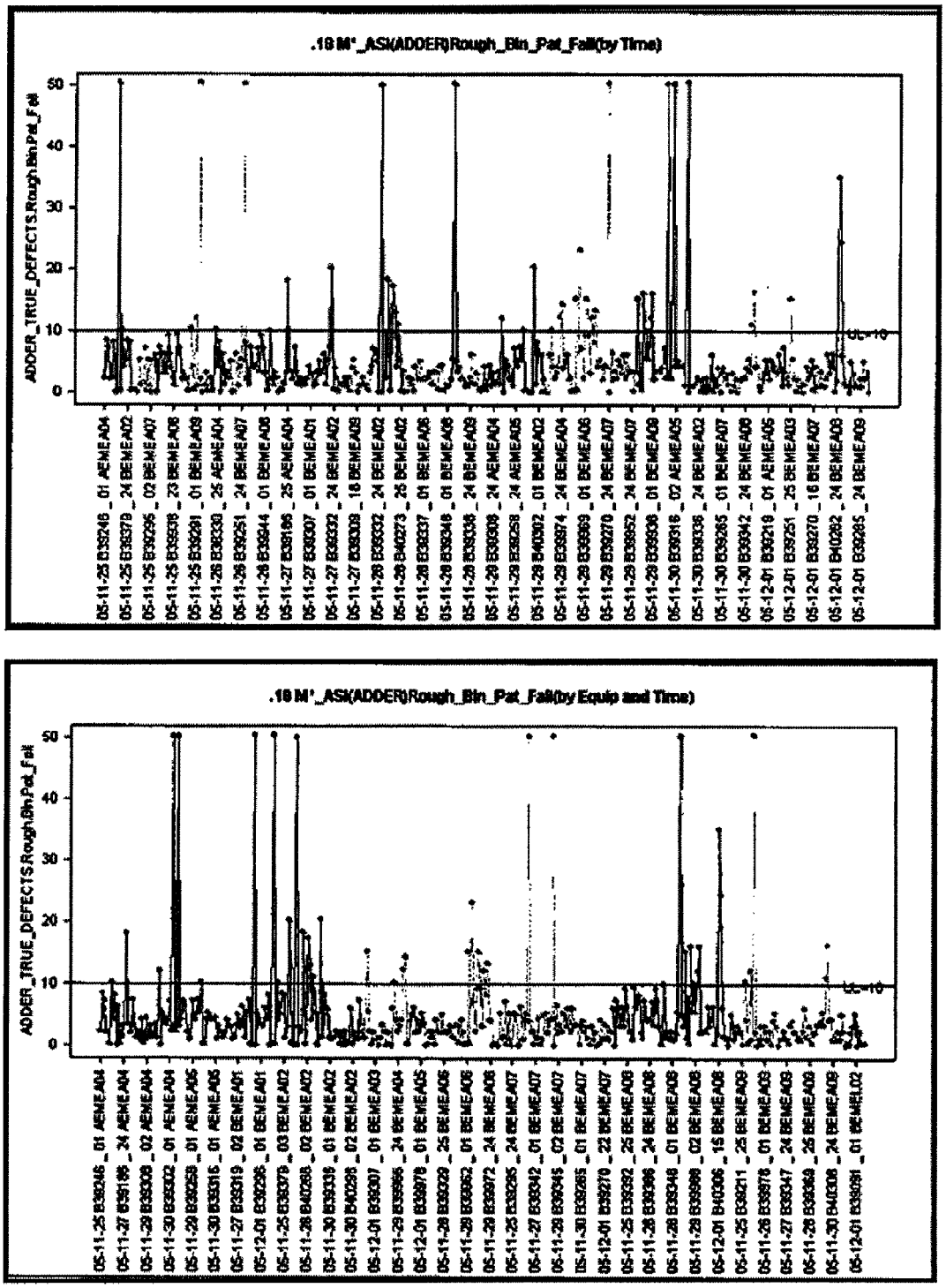
Figure 8:
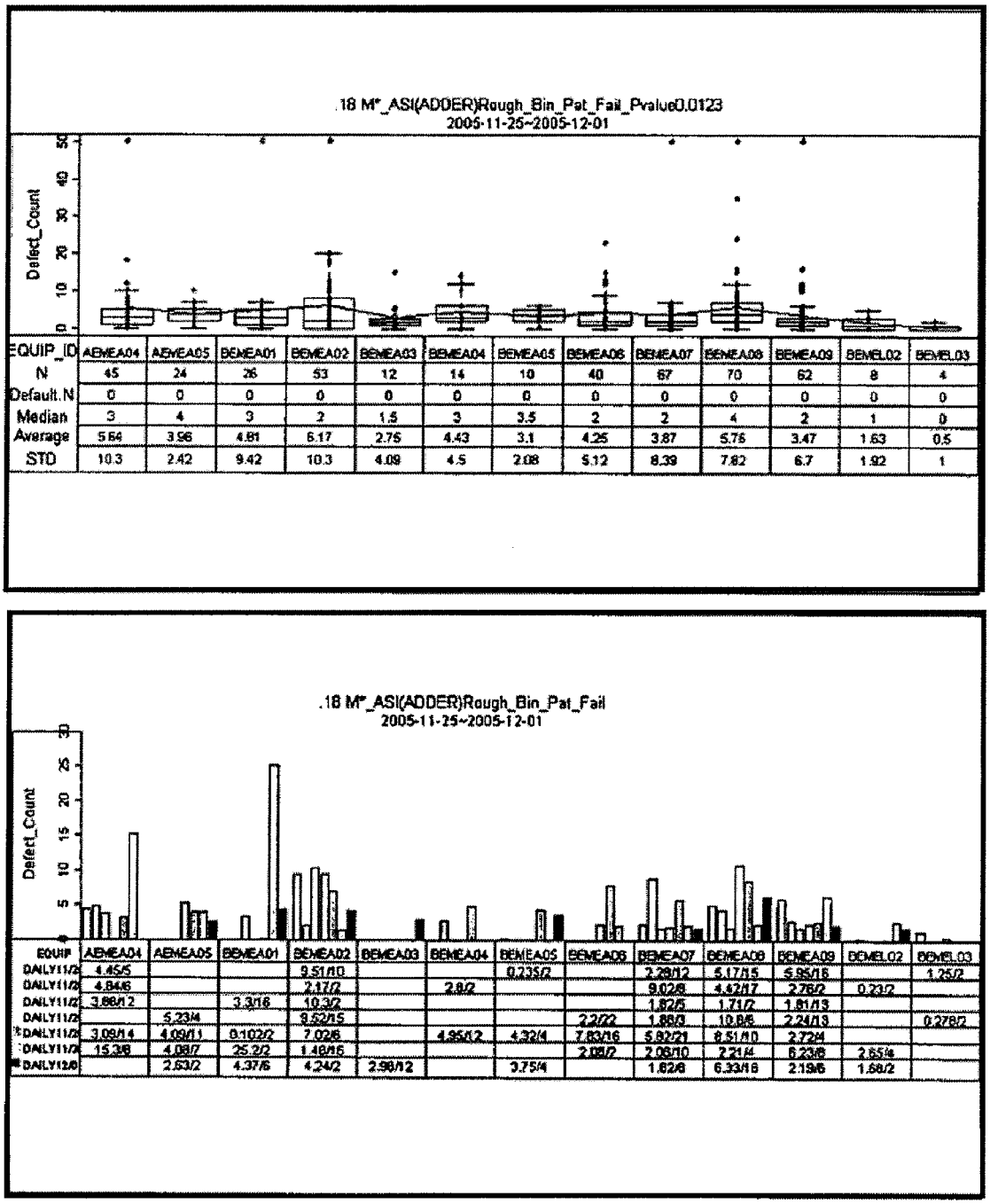

In addition, the various embodiments of the present invention may be implement in conjunction with other non-parametric as well as parametric statistical tools (e.g., normal distribution, etc.). FIGS. 6-8 are simplified diagram illustrating various statistical methods used for identifying sources for defects. These diagrams merely provide an example, which should not unduly limit the scope of the claims. One of ordinary skill in the art would recognize many variations, alternatives, and modifications.

In a specific embodiment, the invention provides a method for identifying one or more sources for possible causing manufacturing detects in integrated circuits. The method includes a step for providing a plurality of semiconductor substrates. The method also includes a step for processing the plurality of semiconductor substrates in a plurality of processing steps using a plurality of processing tools. The method additionally includes a step for providing a database, which includes data associated with the processing of the plurality of semiconductor substrates. The method further includes a step for testing the plurality of semiconductor wafers after the processing of the plurality of semiconductor substrates. Additionally, the method includes a step for detecting at least one defect characteristic associated with the plurality of the semiconductor substrates that have been processed. Moreover, the method includes a step for identifying a set of processing steps. For example, the set of processing step are possibly associated with the defect characteristic. Furthermore, the method includes a step for identifying a set of processing tools based on the data. For example, the processing tools are possibly associated with the set of processing steps and the defect characteristics. The set of processing steps is a subset of the plurality of processing steps. The set of processing tools is a subset of the plurality of processing tools. In addition, the method includes a step for determining a Kruskal-Wallis value. The Kruskal-Wallis value is associated with the set of processing steps and the set of processing tools. Moreover, the method includes a step for identifying a likely source for the at least one defect characteristic based on the Kruskal-Wallis value. For example, the method can be illustrated according to FIG. 4.

According to another embodiment, the present invention provides a system for identifying a source for manufacturing detects. Depending upon application, the system is used in conjunction with a semiconductor manufacturing entity. The semiconductor entity includes a plurality of processing tools for processing a plurality of semiconductor substrates in a plurality of processing steps. The system includes a memory component for storing at least data, which are related to the processing tools and processing steps associated with at least one of the plurality of semiconductors. The system also includes a testing component that is configured for testing processed semiconductor substrates. For example, the testing component is able to detect at least one defect characteristic. The at least one defect characteristic are possible associated with a set of processing steps and a set of processing tools. The set of processing steps is a subset of the plurality of processing steps. The set of processing tools is a subset of the plurality of processing tools. The system also includes an analyzing component that is configured to obtain a set of data from the memory component. The set of data is associated with the defect characteristic. The analyzing component is also configured to determine a Kruskal-Wallis value based on the set of data and to identify at lease one likely source for the defect characteristic. For example the system can be illustrated according to FIG. 3.

According to yet another embodiment, the present invention provides a method for identifying a source for manufacturing detects for integrated circuits. The method includes a step for providing a plurality of semiconductor substrates. The method also includes a step for processing the plurality of semiconductor substrates in a plurality of processing steps using a plurality of processing tools. The method additionally includes a step for providing a database, which includes data associated with the processing of the plurality of semiconductor substrates. The method also includes a step for testing the plurality of semiconductor wafers after the processing of the plurality of semiconductor substrates. The method additionally includes a step for identifying at least one defect characteristic associated with the plurality of the semiconductor substrates that have been processed. In addition, the method includes a step for identifying a set of processing steps, which is possibly associated with the defect characteristic. Furthermore, the method includes a step for identifying a set of processing tools based on the data. The set of processing tools is possibly associated with the set of processing steps and the defect characteristics. The method further includes a step for determining a distribution of the at least one defect characteristic over the set of processing steps. In addition, the method includes a step for determining at least one ranking value using a non-parametric equation. Moreover, the method includes a step for identifying a likely source for the at least one defect characteristic based on the at least one ranking value. For example, the method can be illustrated according to FIG. 4.

It is to be appreciated that various embodiments of the present invention provide many advantages over conventional techniques. According to certain embodiments, the present invention utilizes non-parametric statistical tools to identify sources for manufacturing defects. For example, an embodiment of the present invention uses the Kruskal-Wallis test to identify late latent defects. According to a specific embodiment, the present invention provides a fast and automated solution for identifying sources for defects. For example, data relating to the processing of semiconductor substrates are automatically collected and analyzed. In addition, it is to be appreciated the various embodiments of the present invention are compatible with existing and conventional techniques. There are other benefits as well.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for identifying one or more sources for possible causing manufacturing detects in integrated circuits, the method comprising:
   providing a plurality of semiconductor substrates;
   processing the plurality of semiconductor substrates in a plurality of processing steps using a plurality of processing tools;
   providing a database, the database including data associated with the processing of the plurality of semiconductor substrates;
   testing the plurality of semiconductor wafers after the processing of the plurality of semiconductor substrates;
   detecting at least one physical defect characteristic associated with the plurality of the semiconductor substrates that have been processed;
   identifying a set of processing steps, the set of processing steps being possibly associated with the physical defect characteristic;
   identifying a set of processing tools based on the data, the set of processing tools being possibly associated with the set of processing steps and the physical defect characteristics, the set of processing steps being a subset of the plurality of processing steps, the set of processing tools being a subset of the plurality of processing tools;
   determining a Kruskal-Wallis value, the Kruskal-Wallis value being associated with the set of processing steps and the set of processing tools; and
   identifying a likely source for the at least one physical defect characteristic based on the Kruskal-Wallis value.

2. The method of claim 1 wherein the physical defect characteristic is associated with an abnormal distribution.

3. A system for identifying a source for manufacturing detects, the system being used in conjunction with a semiconductor manufacturing entity, wherein the semiconductor entity includes a plurality of processing tools for processing a plurality of semiconductor substrates in a plurality of processing steps, the system comprising:
   a memory component for storing at least data, the data being related to the processing tools and processing steps associated with at least one of the plurality of semiconductors;
   a testing component being configured for testing processed semiconductor substrates, the testing component being able to detect at least one physical defect characteristic, the at least one physical defect characteristic being possibly associated with a set of processing steps and a set of processing tools, the set of processing steps being a subset of the plurality of processing steps, the set of processing tools being a subset of the plurality of processing tools; and
   an analyzing component being configured to obtain a set of data from the memory component, the set of data being associated with the defect characteristic, to determine a Kruskal-Wallis value based on the set of data, and to identify at lease one likely source for the physical defect characteristic.

4. A method for identifying a source for manufacturing detects for integrated circuits, the method comprising:
   providing a plurality of semiconductor substrates;
   processing the plurality of semiconductor substrates in a plurality of processing steps using a plurality of processing tools;
   providing a database, the database including data associated with the processing of the plurality of semiconductor substrates;
   testing the plurality of semiconductor wafers after the processing of the plurality of semiconductor substrates;
   identifying at least one physical defect characteristic associated with the plurality of the semiconductor substrates that have been processed;
   identifying a set of processing steps, the set of processing step being possibly associated with the physical defect characteristic;
   identifying a set of processing tools based on the data, the set of processing tools being possibly associated with the set of processing steps and the physical defect characteristics;
   determining a distribution of the at least one physical defect characteristic over the set of processing steps;
   determining at least one ranking value using a non-parametric equation; and
   identifying a likely source for the at least one physical defect characteristic based on the at least one ranking value.

5. The method of claim 1 wherein the likely source comprises a processing step.

6. The method of claim 1 wherein the defect characteristic is associated with an abnormal distribution.

7. The method of claim 1 wherein the plurality of processing tools comprise four processing tools.

8. The method of claim 1 further comprising determining a ranking of likely sources for the at least one defect.

9. The method of claim 1 wherein the data comprises a log, the log including entries associated with the plurality of processing steps and the plurality of processing tools.

10. The method of claim 1 wherein determining a Kruskal-Wallis value comprises calculating a non-parametric equation.

11. The method of claim 1 wherein at least one of the plurality of the processing tools is configured to perform two or more processing steps.

12. The method of claim 1 wherein the Kruskal-Wallis value is a positive value.

13. The method of claim 1 further comprising calculating a probability value based on the Kruskal-Wallis value for one of the plurality of processing tools.

14. A system for identifying a source for manufacturing detects, the system being used in conjunction with a semiconductor manufacturing entity, wherein the semiconductor entity includes a plurality of processing tools for processing a plurality of semiconductor substrates in a plurality of processing steps, the system comprising:
   a memory component for storing at least data, the data being related to the processing tools and processing steps associated with at least one of the plurality of semiconductors;

a testing component being configured for testing processed semiconductor substrates, the testing component being able to detect at least one defect characteristic, the at least one defect characteristic being possibly associated with a set of processing steps and a set of processing tools, the set of processing steps being a subset of the plurality of processing steps, the set of processing tools being a subset of the plurality of processing tools; and an analyzing component being configured to obtain a set of data from the memory component, the set of data being associated with the defect characteristic, to determine a Kruskal-Wallis value based on the set of data, and to identify at lease one likely source for the defect characteristic.

15. The system of claim 14 wherein the memory component is configured to receive data from the semiconductor manufacturing entity.

16. The system of claim 14 wherein the testing component comprises a electrical tester.

17. The system of claim 14 wherein the testing component comprises an adder tester.

18. The system of claim 14 wherein the testing component comprises a logic tester.

19. The system of claim 14 wherein the analyzing components comprises a processor for determining the Kruskal-Wallis value.

20. The system of claim 14 wherein one of the processing tools is configured to perform two or more processing steps.

21. A method for identifying a source for manufacturing detects for integrated circuits, the method comprising:
providing a plurality of semiconductor substrates;
processing the plurality of semiconductor substrates in a plurality of processing steps using a plurality of processing tools;
providing a database, the database including data associated with the processing of the plurality of semiconductor substrates;
testing the plurality of semiconductor wafers after the processing of the plurality of semiconductor substrates;
identifying at least one defect characteristic associated with the plurality of the semiconductor substrates that have been processed;
identifying a set of processing steps, the set of processing step being possibly associated with the defect characteristic;
identifying a set of processing tools based on the data, the set of processing tools being possibly associated with the set of processing steps and the defect characteristics;
determining a distribution of the at least one defect characteristic over the set of processing steps;
determining at least one ranking value using a non-parametric equation; and
identifying a likely source for the at least one defect characteristic based on the at least one ranking value.

22. The method of claim 21 where the non-parametric equation is a Kruskal-Wallis equation.

23. The method of claim 21 where the non-parametric equation is a Poisson regression equation.

24. The method of claim 21 where the non-parametric equation is an Avona equation.

* * * * *